(12) United States Patent
Imai et al.

(10) Patent No.: US 8,488,644 B2
(45) Date of Patent: Jul. 16, 2013

(54) SEMICONDUCTOR LASER ELEMENT AND MANUFACTURING METHOD THEREOF

(75) Inventors: Suguru Imai, Tokyo (JP); Keishi Takaki, Tokyo (JP); Norihiro Iwai, Tokyo (JP); Kinuka Tanabe, Tokyo (JP); Hitoshi Shimizu, Tokyo (JP); Hirotatsu Ishii, Tokyo (JP)

(73) Assignee: Furukawa Electric Co., Ltd., Tokyo (JP)

( * ) Notice: Subject to any disclaimer, the term of this patent is extended or adjusted under 35 U.S.C. 154(b) by 15 days.

(21) Appl. No.: 13/133,946

(22) PCT Filed: Dec. 10, 2009

(86) PCT No.: PCT/JP2009/070693
§ 371 (c)(1),
(2), (4) Date: Jul. 19, 2011

(87) PCT Pub. No.: WO2010/067845
PCT Pub. Date: Jun. 17, 2010

(65) Prior Publication Data
US 2011/0261852 A1    Oct. 27, 2011

(30) Foreign Application Priority Data
Dec. 10, 2008    (JP) .................................. 2008-314530

(51) Int. Cl.
*H01S 5/00* (2006.01)
(52) U.S. Cl.
USPC ...................................... 372/46.01; 438/542
(58) Field of Classification Search
USPC ...................................... 372/46.01; 438/542
See application file for complete search history.

(56) References Cited

U.S. PATENT DOCUMENTS

| 5,245,622 | A | * | 9/1993 | Jewell et al. ............... 372/45.01 |
| 6,337,493 | B1 | | 1/2002 | Tanizawa et al. |
| 6,618,414 | B1 | * | 9/2003 | Wasserbauer et al. ..... 372/45.01 |
| 6,750,071 | B2 | | 6/2004 | Chirovsky et al. |
| 6,916,672 | B2 | | 7/2005 | Chirovsky et al. |
| 2004/0180460 | A1 | | 9/2004 | Chirovsky et al. |

(Continued)

FOREIGN PATENT DOCUMENTS

| JP | 2000-307149 A | 11/2000 |
| JP | 2007-288089 A | 11/2007 |
| JP | 2008-244470 A | 10/2008 |
| JP | 2009-246035 A | 10/2009 |

OTHER PUBLICATIONS

Applied Physics Letters vol. 29, No. 4, Aug. 15, 1976 p. 263-265.

(Continued)

*Primary Examiner* — Tod T Van Roy
(74) *Attorney, Agent, or Firm* — SOLARIS Intellectual Property Group, PLLC

(57) ABSTRACT

A semiconductor laser element includes a first electrode, a second electrode, a first reflecting mirror, a second reflecting mirror, and a resonator. The resonator includes an active layer, a current confinement layer, a first semiconductor layer having a first doping concentration formed at a side opposite to the active layer across the current confinement layer, and a second semiconductor layer having a second doping concentration higher than the first doping concentration formed between the first semiconductor layer and the current confinement layer. The first electrode is provided to contact a part of a surface of the first semiconductor layer. The first semiconductor layer has a diffusion portion into which a component of the first electrode diffuses. The second semiconductor layer contacts the diffusion portion. The second semiconductor layer is positioned at a node of a standing wave at a time of laser oscillation of the semiconductor laser element.

19 Claims, 6 Drawing Sheets

U.S. PATENT DOCUMENTS

2007/0249109 A1    10/2007    Kamiyama et al.
2008/0212633 A1     9/2008    Shimizu et al.

OTHER PUBLICATIONS

Partial English language translation of the following: Office action dated Dec. 11, 2012 from the Japanese Patent Office in a Japanese patent application corresponding to the instant patent application. This office action translation is submitted now in order to supplement the understanding of patent document JP 2009-246035 which is cited in the office action and is being disclosed in the instant Information Disclosure Statement.

\* cited by examiner

SEMICONDUCTOR LASER ELEMENT AND MANUFACTURING METHOD THEREOF

TECHNICAL FIELD

The present invention relates to a semiconductor laser element and a manufacturing method thereof, and more particularly, to a vertical cavity surface emitting laser (VCSEL) element and a manufacturing method thereof.

BACKGROUND ART

As a conventional VCSEL element, a VCSEL element including a plurality of semiconductor layers including an active layer between upper and lower multilayer reflecting mirrors, i.e., distributed Bragg reflector (DBR) mirrors, is disclosed (see, for example, U.S. Pat. No. 6,916,672 and U.S. Pat. No. 6,750,071). Each of VCSEL elements disclosed in U.S. Pat. No. 6,916,672 and U.S. Pat. No. 6,750,071 has a mesa post structure and includes a current confinement layer to confine a current path and to improve current injection efficiency. The current confinement layer has a current blocking portion of $Al_2O_3$ positioned at the outer circumference and a circular current injection portion of AlAs positioned at the center of the current blocking portion. The current injection portion serves as a current path when a current is injected into the VCSEL element and an aperture from which a laser light is emitted.

Each of the VCSEL elements disclosed in U.S. Pat. No. 6,916,672 and U.S. Pat. No. 6,750,071 includes a contact layer of a $p^+$-type semiconductor having an increased p-type doping concentration with low resistance at a predetermined position of an uppermost layer of the semiconductor layers to improve current injection efficiency from a p-side annular electrode. The current injected from the p-side annular electrode is efficiently injected into the active layer via the current confinement layer, using the contact layer as the current path. As a result, an oscillation threshold current of the VCSEL element decreases.

DISCLOSURE OF THE INVENTION

However, when the inventors manufactured the above conventional VCSEL element, the inventors found that a driving voltage was higher than a design value.

In view of the above aspects, an object of the present invention is to provide a VCSEL element that can prevent or suppress an increase of the driving voltage.

According to a first aspect of the present invention, there is provided a semiconductor laser element including a first electrode, a second electrode, a first reflecting mirror, a second reflecting mirror, and a resonator provided between the first reflecting mirror and the second reflecting mirror and including an active layer, a current confinement layer confining a path of a current flowing between the first electrode and the second electrode and having a first region in which the current flows and a second region that blocks a flow of the current, a first semiconductor layer formed at a side opposite to the active layer across the current confinement layer, and a second semiconductor layer formed between the first semiconductor layer and the current confinement layer. The first semiconductor layer has its upper surface at a side opposite to the current confinement layer. The first semiconductor layer includes a first region that faces the first region of the current confinement layer and a second region that faces the second region of the current confinement layer. The first electrode is provided to contact at least a part of the upper surface of the first semiconductor layer in the second region. The first semiconductor layer has a diffusion portion where a component of the first electrode or at least a part of components of the first electrode diffuses into at least the first semiconductor layer. The second semiconductor layer has a doping concentration higher than that of the first semiconductor layer. The second semiconductor layer contacts at least the diffusion portion and extends from a region contacting the diffusion portion to a position facing the first region of the current confinement layer.

According to a second aspect of the present invention, there is provided a method of manufacturing a semiconductor laser element, including a step of preparing a substrate including an active layer, a layer made of compound semiconductor containing Al, and a first semiconductor layer provided on the layer made of the compound semiconductor containing Al and including a second semiconductor layer having a first surface and a second surface facing each other and a third semiconductor layer contacting the second surface of the second semiconductor layer, provided between the layer made of the compound semiconductor containing Al and the second semiconductor layer and having a doping concentration higher than a doping concentration of the second semiconductor layer, a step of providing an electrode on one surface of the second semiconductor layer to contact the one surface, a step of processing the substrate in a self-aligning manner with respect to the electrode to form a mesa portion that exposes the layer made of the compound semiconductor containing Al around an entire side surface of the mesa portion, and a step of oxidizing the layer made of the compound semiconductor containing Al from an exposed portion of the layer made of the compound semiconductor containing Al, to form the layer made of the compound semiconductor containing Al into a current confinement layer having a first region made of the compound semiconductor containing Al and a second region made of an oxidized insulating material obtained by oxidation of Al contained in the compound semiconductor around the first region, and to form a diffusion portion where a component of the electrode or at least a part of components of the first electrode diffuses into the second semiconductor layer.

PREFERRED EMBODIMENT FOR CARRYING OUT THE INVENTION

As described above, when the inventors manufactured the conventional VCSEL element, the inventors found that a driving voltage was higher than a design value. A through investigation of the manufactured VCSEL element made it clear that the increase of the driving voltage is caused by the following factors.

Figure 7:
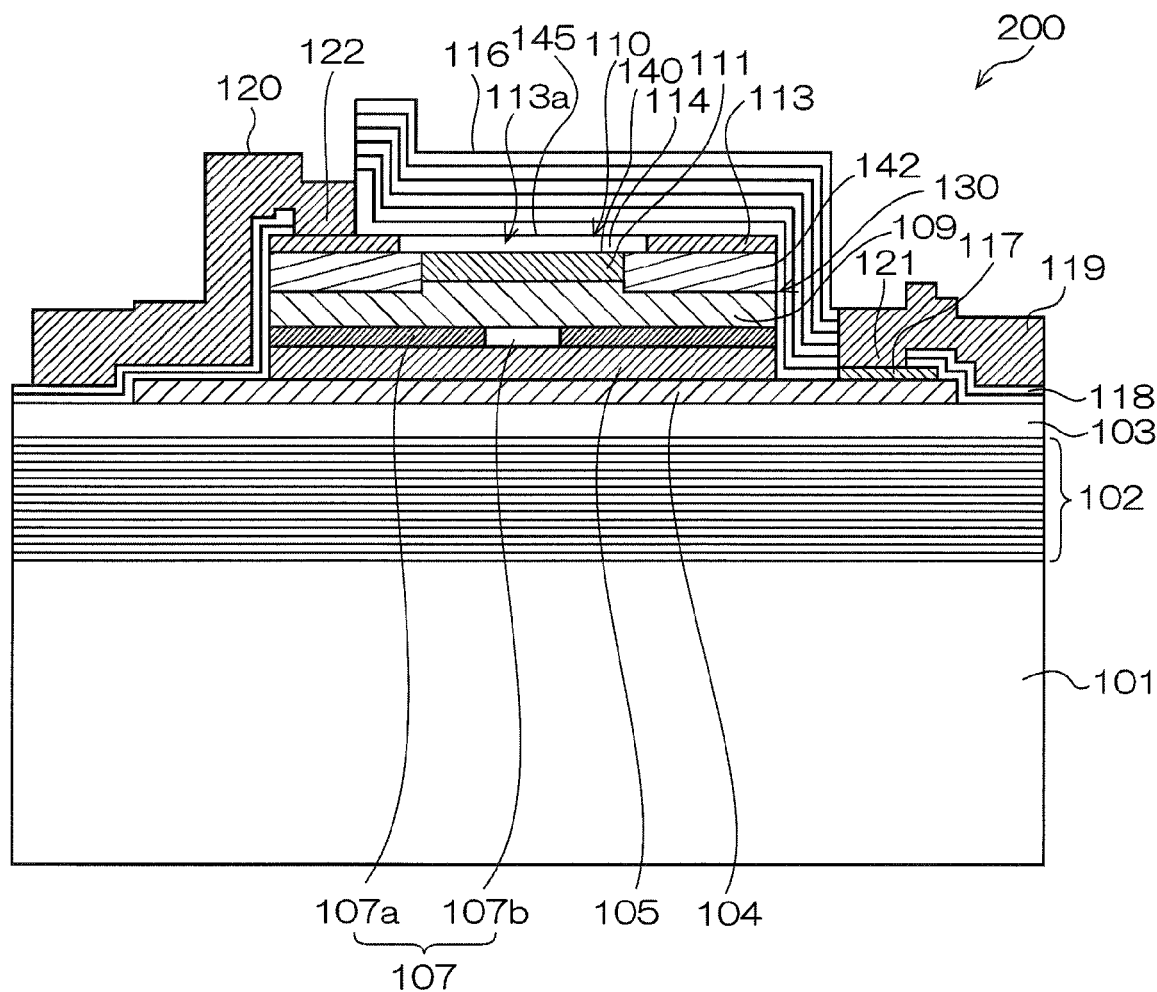
FIG. 7 is a schematic vertical cross-sectional view of the conventional VCSEL element.

As shown in FIG. 7, a conventional VCSEL element 200 has a structure in which a current confinement layer 107 having a current confinement portion 107a at the outer circumference and a circular current injection portion 107b at the center of the current confinement portion 107a, a p-type spacer layer 109, and a p$^+$-type contact layer 111 are sequentially grown. A p-side annular electrode 113 is formed on the p$^+$-type contact layer 111 and a phase adjusting layer 114 of silicon nitride having a circular plate shape is formed in an aperture 113a of the p-side annular electrode 113. The p-side annular electrode 113 has a structure in which the p$^+$-type contact layer 111 side is Ti and Pt is deposited on Ti (hereinafter, a "Ti/Pt structure"). On the electrode 113 and the phase adjusting layer 114, an upper DBR mirror 116 of a dielectric multilayer is formed. An active layer 105 is positioned below the current confinement layer 107. The conventional VCSEL element 200 has a columnar mesa post structure 130 at least from the active layer 105 to the p$^+$-type contact layer 111.

Figure 8:
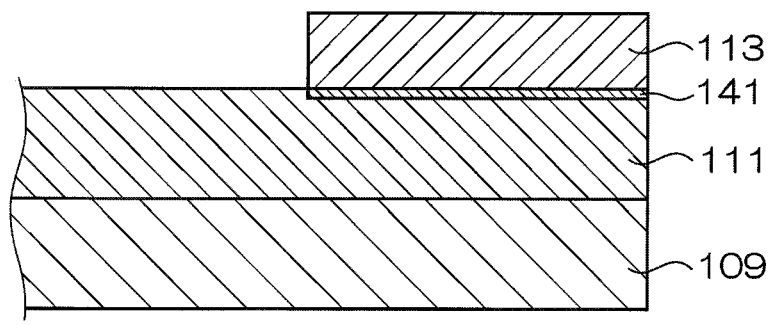
FIG. 8 is a partially enlarged schematic vertical cross-sectional view of the conventional VCSEL element.

In the conventional VCSEL element 200, Ti that is a metal having a low reactive property has been mainly used as a base metal of the electrode 113. A reactive property of Ti with a semiconductor layer is low. As shown in FIG. 8, a diffusion layer 141 of a thickness only sufficient for generating an ohmic contact is formed in the vicinity of an interface with the p$^+$-type contact layer 111.

However, according to the findings of the inventors, the p$^+$-type contact layer 111 right below the p-side annular electrode 113 is lost and a diffusion layer 142 where Ti forming the lowermost layer of the p-side annular electrode 113 diffuses is formed at a layer that is supposed to function as the p$^+$-type contact layer 111. According to the investigation by the inventors, the diffusion layer 142 is mainly formed when oxidation treatment is performed at a high temperature in a process of forming the current confinement layer 107 of the VCSEL element 200.

Figure 9:
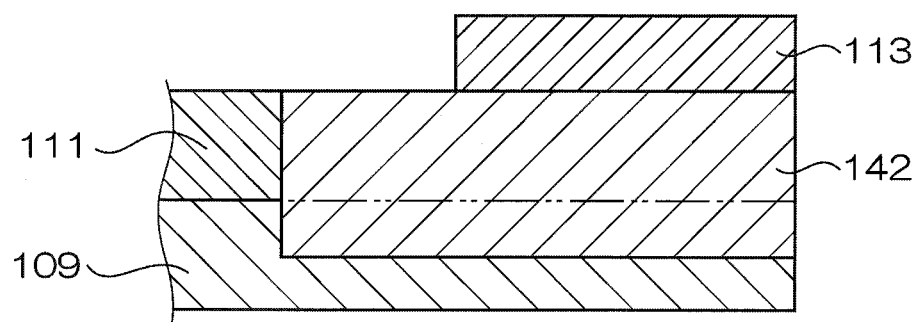
FIG. 9 is a partially enlarged schematic vertical cross-sectional view of the conventional VCSEL element.

If a device is actually manufactured, as shown in FIG. 9, alloying with the semiconductor layer, which is different from a simple diffusion of Ti into the semiconductor layer, is progressed, and an alloy layer passes through the contact layer 111. As a result, a contact area of a Ti-alloy layer and the p$^+$-type contact layer 111 having low resistance decreases and a contact area with the p-type spacer layer 109 having resistance higher than that of the p$^+$-type contact layer 111 increases. This causes the total element resistance to increase, and as a result, a driving voltage increases.

Figure 6:
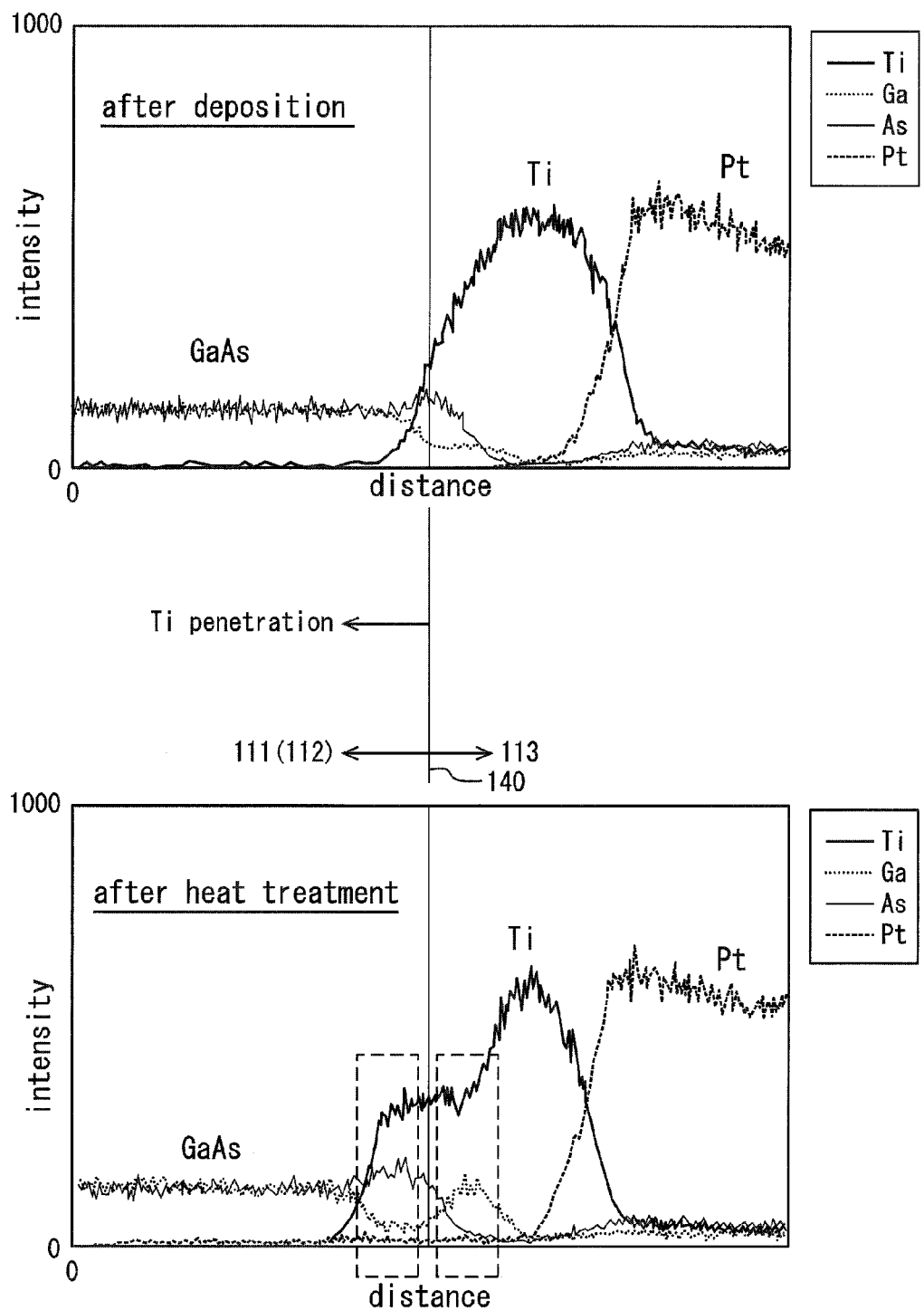
FIG. 6 is a diagram illustrating Auger electron spectroscopy spectrums of the VCSEL element according to the embodiment and the conventional VCSEL element in a depth direction.

As shown in FIG. 6, when the electrode 113 was formed and heat treatment was performed, Ti diffused into the semiconductor side.

The embodiment has been derived by the inventors based on the above-mentioned findings. A semiconductor laser element according to the embodiment includes a first electrode, a second electrode, a first reflecting mirror, a second reflecting mirror, and a resonator provided between the first reflecting mirror and the second reflecting mirror and including an active layer, a current confinement layer confining a path of a current flowing between the first electrode and the second electrode and having a first region in which the current flows and a second region that blocks a flow of the current, a first semiconductor layer at a side opposite to the active layer across the current confinement layer, and a second semiconductor layer formed between the first semiconductor layer and the current confinement layer. The first semiconductor layer has its upper surface at a side opposite to the current confinement layer. The first semiconductor layer includes a first region that faces the first region of the current confinement layer and a second region that faces the second region of the current confinement layer. The first electrode is provided to contact at least a part of the upper surface of the first semiconductor layer in the second region. The first semiconductor layer has a diffusion portion where a component of the first electrode or at least a part of components of the first electrode diffuses into at least the first semiconductor layer. The second semiconductor layer has a doping concentration higher than that of the first semiconductor layer. The second semiconductor layer contacts at least the diffusion portion and extends from a region contacting the diffusion portion to a position facing the first region of the current confinement layer.

In the conventional technology, the first semiconductor layer is not provided and the first electrode directly contacts the second semiconductor layer having the high doping concentration. Since the second semiconductor layer having the high doping concentration is an optical path of laser light, the second semiconductor layer cannot be formed to be thick. For this reason, after being subjected to a thermal history, the diffusion portion where a component of the first electrode or at least a part of the components of the first electrode diffuses into the second semiconductor layer having the high doping concentration passes through the second semiconductor layer. As a result, a part of the diffusion portion that contacts the second semiconductor layer becomes only a side surface of the diffusion portion and the side surface is a surface of the second semiconductor layer in a depth direction. Therefore, a contact area with the second semiconductor layer having a low resistance and the high doping concentration becomes considerably small, eventually increasing the element resistance, which results in an increase of the driving voltage.

On the other hand, according to the embodiment, the first semiconductor layer exists between the first electrode and the second semiconductor layer having the high doping concentration, and a component of the first electrode or at least a part of the components of the first electrode first diffuses into the first semiconductor layer to form the diffusion portion. Therefore, even though the component or the part of the components diffuses into the second semiconductor layer to form a diffusion portion in the second semiconductor layer, the diffusion portion can be prevented from passing through the second semiconductor layer. Therefore, the diffusion portion contacts the second semiconductor layer at the side surface and the bottom surface having an area much larger than that of the side surface, a contact area with the second semiconductor layer having low resistance with the high doping concentration increases. Furthermore, the area of the bottom surface of the diffusion portion is equal to or larger than that of a bottom surface of the first electrode. Therefore, the increase of the element resistance can be prevented or suppressed. As a result, the increase of the driving voltage can be prevented or suppressed. Although such words as the side surface and bottom surface are used, these words are used merely use for the sake of explanation, and therefore, these words should not be construed to limit the scope of the present invention.

Although an alternative configuration in which a thick second semiconductor layer having the high doping concentration is formed without employing the first semiconductor layer can be adopted, since the second semiconductor layer is a part of the optical path of the laser light, it is preferable not to use the thick second semiconductor layer having the high impurity concentration in order to prevent a decrease of an optical output. In the embodiment of the present invention, the two layer structure including the second semiconductor layer having the high doping concentration and the first semiconductor layer having the impurity concentration lower than that of the second semiconductor layer is employed. Therefore, because the second semiconductor layer having the high doping concentration does not need to be formed to be thick, the decrease of the optical output can be prevented or suppressed.

Preferably, the doping concentration of the first semiconductor layer is lower than the doping concentration of the second semiconductor layer by at least a single digit.

Preferably, the diffusion portion not only contacts the second semiconductor layer, but diffuses into about a half portion of the second semiconductor layer.

In a portion of the first semiconductor layer that contacts the first electrode, the material forming the layer of the first electrode contacting the first semiconductor layer diffuses into all portions in a thickness direction, and lower and more stabilized contact resistance of the electrode can be realized.

Preferably, the above-mentioned semiconductor laser element further includes a substrate, and a mesa portion that is formed on the substrate, where the mesa portion includes at least the first semiconductor layer, the second semiconductor layer and the current confinement layer, and the first region of the current confinement layer is made of a compound semiconductor containing Al, and the second region of the current confinement layer is made of an oxidized insulating material obtained by oxidation of Al contained in the compound semiconductor.

More preferably, the second region of the current confinement layer is provided around the first region of the current confinement layer.

More preferably, the first electrode is provided on the mesa portion, the mesa portion is formed in a self-aligning manner with respect to the first electrode, and the second region of the current confinement layer is exposed at a side surface of the mesa portion.

More preferably, the first reflecting mirror, the first electrode, the first semiconductor layer, the second semiconductor layer, the current confinement layer, the active layer, and the second reflecting mirror are disposed in this order.

Preferably, one end of the resonator is the upper surface of the first region of the first semiconductor layer.

Preferably, the semiconductor laser element further includes a phase adjusting layer that contacts the upper surface of the first region of the first semiconductor layer, provided at a side opposite to the second semiconductor layer across the first semiconductor layer, and adjusts a phase of a standing wave propagated through the resonator, and has its upper surface at a side opposite to the first region of the first semiconductor layer, where one end of the resonator is the upper surface of the phase adjusting layer.

Preferably, a center of a thickness of the second semiconductor layer is positioned within a node of light intensity of a standing wave at a time of laser oscillation of the semiconductor laser element ±11 nm. This configuration is preferably used, because the second semiconductor layer having the high doping concentration is positioned at a resonance node or at a neighboring portion thereof. If the center of the thickness is out of this range, the threshold current is more than the double by optical loss of the second semiconductor layer. More preferably, the center of the thickness of the second semiconductor layer is positioned within the node of light intensity of the standing wave at a time of laser oscillation of the semiconductor laser element ±5 nm, and most preferably, the center of the thickness of the second semiconductor layer is positioned at the node of light intensity of the standing wave at a time of laser oscillation of the semiconductor laser element.

Preferably, a portion of the first electrode that contacts the first semiconductor layer includes at least one metal selected from a group consisting of Ti, Cr, Al, and W and the component that diffuses into the first semiconductor layer is the at least one metal selected from the group consisting of Ti, Cr, Al, and W.

Preferably, the portion of the first electrode that contacts the first semiconductor layer includes one metal selected from the group consisting of Ti, Cr, Al, and W and the component that diffuses into the first semiconductor layer is the metal selected from the group consisting of Ti, Cr, Al, and W.

More preferably, the portion of the first electrode that contacts the first semiconductor layer includes Ti and the component that diffuses into the first semiconductor layer is Ti.

Since the portion of the first electrode that contacts the first semiconductor layer is formed of Ti, diffusion controllability in the first semiconductor layer and the second semiconductor layer is high in a temperature range needed in the heat history during a manufacturing process, and low resistance can be realized.

Preferably, the second semiconductor layer further includes a diffusion portion where the component diffused into the first semiconductor layer diffuses into the second semiconductor layer.

Preferably, when a thickness of the first semiconductor layer and a thickness of the second semiconductor layer satisfy $$a < \sqrt{D_1 e^{-Ea_1/kBT} t_1 + D_2 e^{-Ea_2/kBT} t_2} a + d \qquad (1)$$

where a is the thickness of the first semiconductor layer, d is the thickness of the second semiconductor layer, T is temperature of thermal history process of manufacturing and using the semiconductor laser element, t1 is time when the component diffusing into the first semiconductor layer progresses through the first semiconductor layer, t2 is time when the component diffusing into the first semiconductor layer progresses through the second semiconductor layer, $D_1$ is diffusion coefficient of the component diffusing into the first semiconductor layer in the first semiconductor layer, $D_2$ is diffusion coefficient of the component diffusing into the first semiconductor layer in the second semiconductor layer, $Ea_1$ is intrinsic diffusion energy of the component diffusing into the first semiconductor layer with respect to a material forming the first semiconductor layer, $Ea_2$ is intrinsic diffusion energy of the component diffusing into the first semiconductor layer with respect to material of the second semiconductor layer, and kB is Boltzmann coefficient.

As such, the thickness a of the first semiconductor layer and the thickness d of the second semiconductor layer satisfy the equation 1, and the portion where the component forming the first electrode or at least a part of the components forming the first electrode do not diffuse reliably remains in the second semiconductor layer. Diffusion energies $Ea_1$ and $Ea_2$ of the equation 1 can be estimated using a method disclosed in Appl. Phys. Lett., Vol. 29, No. 4, Aug. 15, 1976, pp. 263-265.

Preferably, a thickness of the first semiconductor layer is from 3 nm to 38 nm.

Preferably, a thickness of the second semiconductor layer is from 15 nm to 30 nm and a distance from the upper face of the first region of the first semiconductor layer to an end of the current confinement layer side of the second semiconductor layer is from 33 nm to 68 nm.

Preferably, the thickness of the first semiconductor layer is from 10 nm to 20 nm.

When the first region of the current confinement layer is made of a compound semiconductor containing Al and the second region of the current confinement layer is made of an oxidized insulating material obtained by oxidation of Al contained in the compound semiconductor, the component forming the first electrode or at least a part of the components forming the first electrode diffuses into the first semiconductor layer or the second semiconductor layer by 20 nm to 30 nm in an oxidization process. Then, by the typical thermal history (for example, a manufacturing process such as a film forming process and heat generation at the time of using the VCSEL element), the component or the components diffuse by 3 nm to 8 nm. Due to an error at the time of manufacturing and in order to prevent an excessive increase in the current density of a portion of the second semiconductor layer facing the first electrode, a portion of 10 nm to 15 nm in which diffusion does not occur is needed. Therefore, a lower limit of the distance from a contact portion where the first electrode contacts an upper surface of the second region of the first semiconductor layer to an end of the second semiconductor layer opposite to the first electrode is preferably 33 (=20+3+10) nm, and more preferably 53 (=30+8+15) nm or more. The thickness of the second semiconductor layer having the high doping concentration is preferably 15 nm to 30 nm to function as the current path. Therefore, an upper limit of the distance from the contact portion where the first electrode contacts the upper surface of the second region of the first semiconductor layer to the end of the second semiconductor layer opposite to the first electrode is preferably 68 (=38+30) nm. The thickness of the first semiconductor layer is preferably 3 (=33−30) nm to 38 (=53−15) nm. The thickness of the first semiconductor layer is preferably 10 nm to 20 nm.

Preferably, a doping concentration of the first semiconductor layer is $2 \times 10^{19}$ cm$^{-3}$ or less. In such concentration, absorption loss of oscillated laser light by the first semiconductor layer can be prevented or suppressed.

Preferably, a doping concentration of the second semiconductor layer is $1 \times 10^{20}$ cm$^{-3}$ or more.

Preferably, an oscillation wavelength of the semiconductor laser element is 850 nm or more.

According to another aspect of the embodiment of the present invention, there is provided a method of manufacturing a semiconductor laser element, including a step of preparing a substrate including an active layer, a layer made of compound semiconductor containing Al, and a first semiconductor layer provided on the layer made of the compound semiconductor containing Al and including a second semiconductor layer having a first surface and a second surface facing each other and a third semiconductor layer contacting the second surface of the second semiconductor layer, provided between the layer made of the compound semiconductor containing Al and the second semiconductor layer and having a doping concentration higher than a doping concentration of the second semiconductor layer, a step of providing an electrode on one surface of the second semiconductor layer to contact the one surface, a step of processing the substrate in a self-aligning manner with respect to the electrode to form a mesa portion that exposes the layer made of the compound semiconductor containing Al around an entire side surface of the mesa portion, and a step of oxidizing the layer made of the compound semiconductor containing Al from an exposed portion of the layer made of the compound semiconductor containing Al, to form the layer made of the compound semiconductor containing Al into a current confinement layer having a first region made of the compound semiconductor containing Al and a second region made of an oxidized insulating material obtained by oxidation of Al contained in the compound semiconductor around the first region, and to form a diffusion portion where a component of the electrode or at least a part of components of the first electrode diffuses into the second semiconductor layer.

Hereinafter, a VCSEL element and a manufacturing method thereof according to the preferred exemplary embodiment of the present invention will be specifically described with reference to the accompanying drawings. However, the present invention is not limited by the specific exemplary embodiment.

First, the VCSEL element according to the exemplary embodiment of the present invention will be described. In the VCSEL element according to this exemplary embodiment, a laser oscillation wavelength is in a 1100-nm band.

Figure 1:
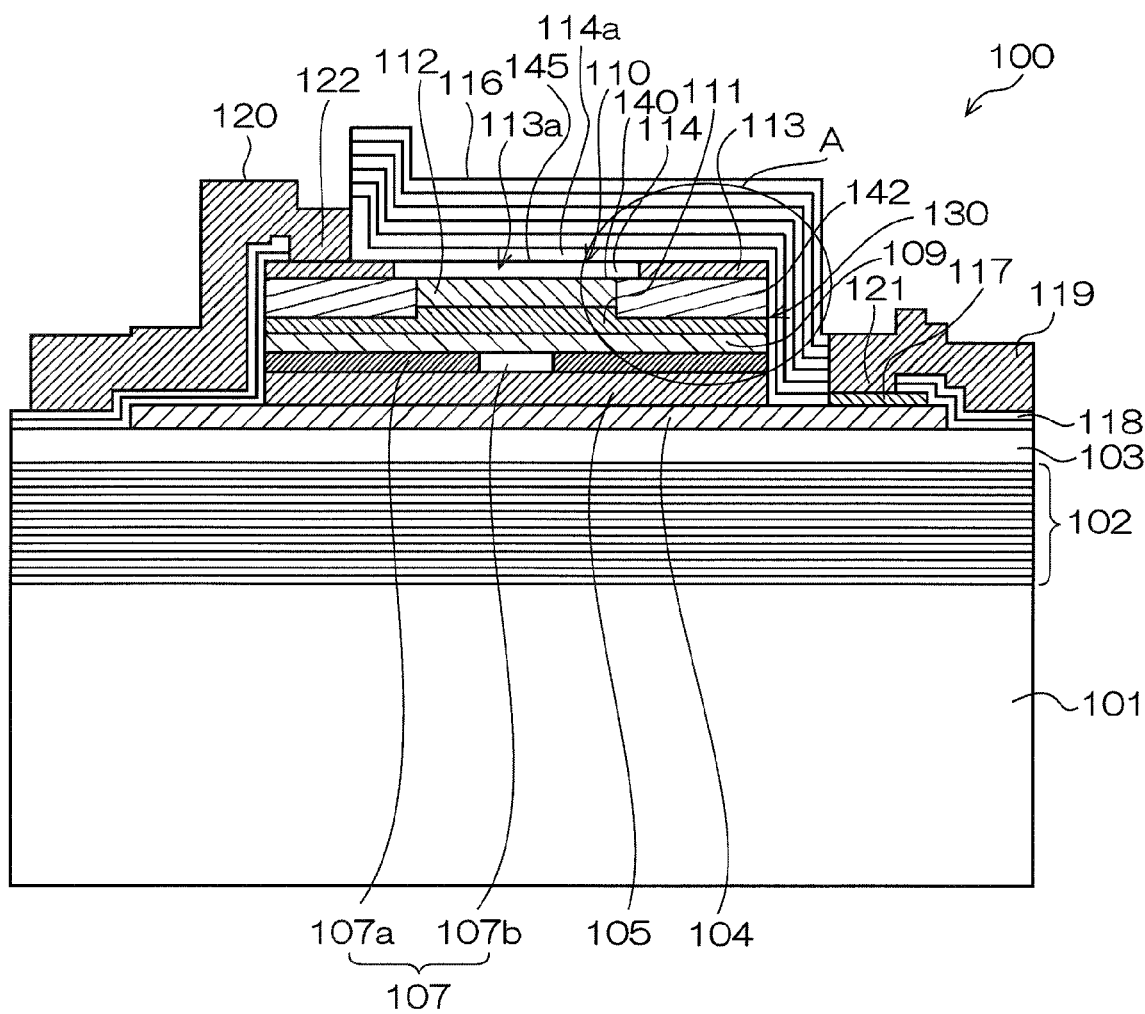
FIG. 1 is a schematic vertical cross-sectional view of a VCSEL element according to an embodiment of the present invention.
Figure 2:
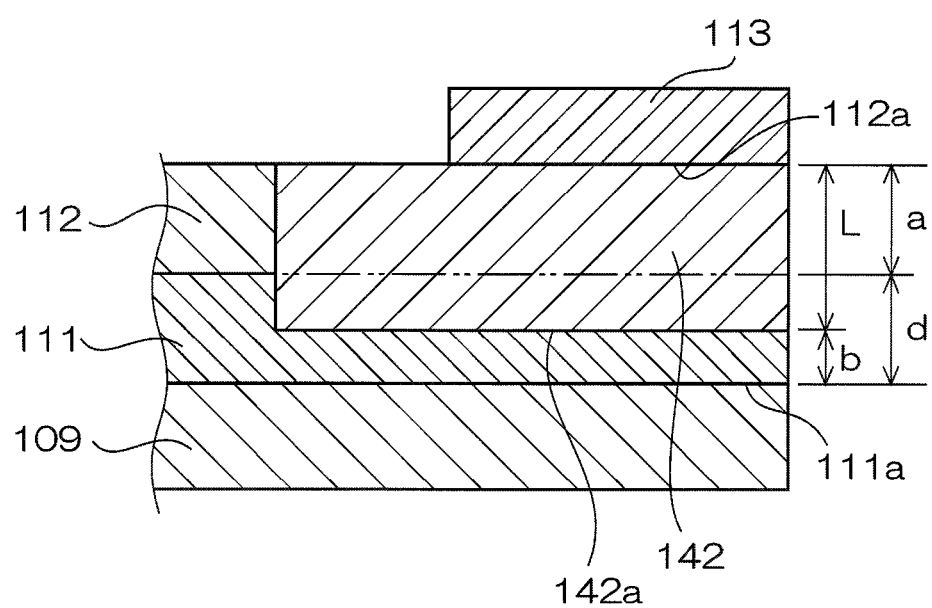
FIG. 2 is an enlarged schematic vertical cross-sectional view of an A portion shown in FIG. 1.

FIG. 1 is a schematic vertical cross-sectional view for explaining a VCSEL element 100 according to the preferred exemplary embodiment of the present invention. As shown in FIG. 1, the VCSEL element 100 has a structure in which a substrate 101, a lower DBR mirror 102 to be a lower semiconductor multilayer film reflecting mirror formed on the substrate 101, a buffer layer 103, an n-type contact layer 104, an active layer 105 having a multiple quantum well structure, a current confinement layer 107 having a current confinement portion 107a positioned at the outer circumference and a circular current injection portion 107b positioned at the center of the current confinement portion 107a, a p-type spacer layer 109, a p$^+$-type contact layer 111, and a low-concentration semiconductor layer 112 are sequentially laminated. A portion from the active layer 105 to the low-concentration semiconductor layer 112 forms a columnar mesa post 130. A p-side annular electrode 113 is formed on the low-concentration semiconductor layer 112 and an n-side electrode 117 is formed on the n-type contact layer 104 outside the mesa post 130.

The substrate 101 is made of undoped GaAs. The lower DBR mirror 102 is made of 34 pairs of a GaAs/Al$_{0.9}$Ga$_{0.1}$As layer. The buffer layer 103 is made of n-type GaAs. The n-type contact layer 104 is made of n-type GaAs. The active layer 105 has a structure in which three GaInAs well layers and four GaAs barrier layers are alternately stacked, and the GaAs barrier layer of the lowermost layer functions as an n-type clad layer. In the current confinement layer 107, the current confinement portion 107a is made of Al$_2$O$_3$ and the current injection portion 107b has the diameter of 6 μm to 7 μm and is made of AlAs. The path of the current that flows between the p-side annular electrode 113 and the n-side electrode 117 is restricted by the current confinement portion 107a and the flow of the current is concentrated on the current injection portion 107b, and the current confinement layer 107 functions as the current confinement layer. The p-type spacer layer 109 and the p$^+$-type contact layer 111 are made of p-type GaAs and p$^+$-type GaAs, and carbon is doped in both layers 109 and 111. The acceptor or donor concentration (called as the doping concentration) of each of p-type or n-type layers is less than $2 \times 10^{19}$ cm$^{-3}$ and, for example, about $1 \times 10^{18}$ cm$^{-3}$. and the acceptor concentration (doping concentration) of the p$^+$-type contact layer 111 is, for example, $1 \times 10^{21}$ cm$^{-3}$. A refractive index of each semiconductor layer that is made of GaAs is about 3.45.

A lower inclination composition layer and an upper inclination composition layer are not provided in the VCSEL element 100 according to this exemplary embodiment. However, the lower inclination composition layer and the upper inclination composition layer are preferably provided to sandwich the current confinement layer 107. In this case, the lower inclination composition layer and the upper inclination composition layer are made of AlGaAs. As the lower inclination composition layer and the upper inclination composition layer come close to the current confinement layer 107 in a thickness direction, "As" composition increase in stepwise.

Further, in order to easily flow the current, a p$^+$-type current path layer (not illustrated in the drawings) is preferably provided in the spacer layer 109. In this case, the p$^+$-type current path layer is made of p$^+$-type GaAs where carbon is doped by $1\times10^{21}$ cm$^{-3}$. In this case, the current path layer becomes two layers. However, the current path layer may become three layers or more.

Figure 3:
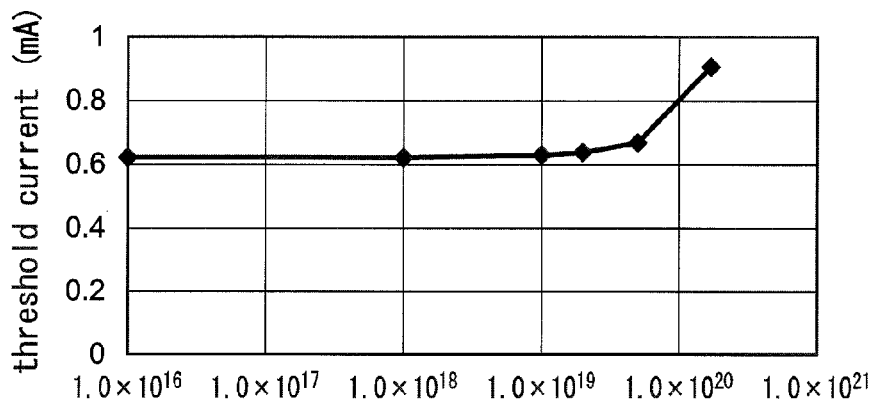
FIG. 3 is a diagram illustrating a relationship between doping concentration of a sacrificial layer in the VCSEL element shown in FIG. 1 and threshold current.
Figure 4:
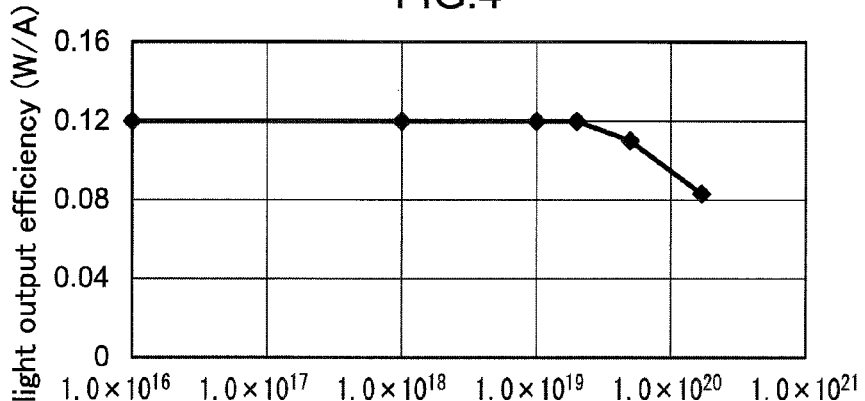
FIG. 4 is a diagram illustrating a relationship between doping concentration of the sacrificial layer in the VCSEL element shown in FIG. 1 and light output efficiency.

On the p$^+$-type contact layer 111, the p-type low-concentration semiconductor layer 112 of p-type made of GaAs is provided. The impurity doping concentration of the p-type low-concentration semiconductor layer 112 of p-type is preferably less than $2\times10^{19}$ cm$^{-3}$. For example, the impurity doping concentration of the p-type low-concentration semiconductor layer 112 is preferably $1\times10^{18}$ cm$^{-3}$. The doping concentration of the low-concentration semiconductor layer 112 is preferably less than $2\times10^{19}$ cm$^{-3}$, because the threshold current increases and light output efficiency is lowered when the doping concentration of the low-concentration semiconductor layer 112 crosses a boundary of about $2\times10^{19}$ cm$^{-3}$, as shown in FIGS. 3 and 4. In this exemplary embodiment, a NID (Not Intentionally Doped)-GaAs layer is used as the low-concentration semiconductor layer 112. The NID-GaAs layer means a GaAs layer that is not intentionally doped at the time of forming a film, and the impurity concentration is about $1\times10^{14}$ cm$^{-3}$ to $1\times10^{16}$ cm$^{-3}$ in this exemplary embodiment.

On the low-concentration semiconductor layer 112 made of GaAs, the p-side annular electrode 113 made of Ti/Pt (structure in which a lower layer contacting the low-concentration semiconductor layer 112 is Ti and Pt is formed thereon), having an opening at the center, and having the outer circumference that is matched with the outer circumference of the mesa post 130 is formed. Ti of the lower side of the p-side annular electrode 113 contacts the low-concentration semiconductor layer 112. The outer diameter of the p-side annular electrode 113 is, for example, 30 µm, and the inner diameter of the aperture 113a is, for example, 11 µm to 14 µm.

A portion of the low-concentration semiconductor layer 112 that contacts the p-side annular electrode 113 becomes the Ti-diffusion layer 142 into which Ti forming a layer of the p-side annular electrode 113 contacting the low-concentration semiconductor layer 112 diffuses. The Ti-diffusion layer 142 passes through the low-concentration semiconductor layer 112, contacts the p$^+$-type contact layer 111, and enters into a portion in the p$^+$-type contact layer 111.

The current confinement portion 107a of the current confinement layer 107 is made of Al$_2$O$_3$ and is formed by oxidizing AlAs, as described below. In this oxidization process, Ti of the lower layer of the p-side annular electrode 113 diffuses into the low-concentration semiconductor layer 112 and the p$^+$-type contact layer 111 by 20 nm to 39 nm. Then, by the typical thermal history (for example, a VCSEL manufacturing process such as a film forming process of the upper DBR mirror 116 or a passivation film 118 and heat generation at the time of using the VCSEL element), Ti diffuses by 3 nm to 8 nm. Due to an error at the time of manufacturing and in order to prevent an excessive increase in the current density of a portion (portion below the p-side annular electrode 113) of the p$^+$-type contact layer 111 opposed to the p-side annular electrode 113, a portion of 10 nm to 15 nm in which diffusion does not occur is needed. Therefore, a lower limit of the distance (a+d) from a contact portion 112a where the p-side annular electrode 113 contacts a surface of the low-concentration semiconductor layer 112 to a bottom surface 111a of the p$^+$-type contact layer 111 is preferably 33 (=20+3+10) nm, and more preferably 53 (=30+8+15) nm or more. The thickness "d" of the p$^+$-type contact layer 111 is preferably 15 nm to 30 nm to function as the current path. Therefore, an upper limit of the distance (a+d) from the contact portion 112a where the p-side annular electrode 113 contacts a surface of the low-concentration semiconductor layer 112 to the bottom surface 111a of the p$^+$-type contact layer 111 is preferably 68 (=38+30) nm. The thickness "a" of the low-concentration semiconductor layer 112 is preferably 3 (=33−30) nm to 38 (=53−15) nm. The thickness "a" of the low-concentration semiconductor layer 112 is more preferably 10 nm to 20 nm.

In this exemplary embodiment, the low-concentration semiconductor layer 112 exists between the p-side annular electrode 113 and the p$^+$-type contact layer 111, and Ti of the lower layer of the p-side annular electrode 113 first diffuses into the low-concentration semiconductor layer 112 to form the Ti-diffusion layer 142. Then, even though Ti diffuses into the p$^+$-type contact layer 111, the Ti-diffusion layer 142 can be prevented from passing through the p$^+$-type contact layer 111. Therefore, the Ti-diffusion layer 142 contacts the p$^+$-type contact layer 111 not only at the side surface, but at a bottom surface 142a having an area much larger than that of the side surface, and as a result, a contact area between the Ti-diffusion layer 142 and the p$^+$-type contact layer 111 increases. Furthermore, the area of the bottom surface 142a is equal to or larger than that of a bottom surface of the p-side annular electrode 113. Therefore, the increase of the element resistance can be prevented or suppressed. As a result, the increase of the driving voltage can be prevented or suppressed.

Although an alternative configuration in which a thick p$^+$-type contact layer 111 is formed without employing the low-concentration semiconductor layer 112 can be adopted in order to simply prevent the Ti-diffusion layer 142 from passing through the p$^+$-type contact layer 111. However, since the p$^+$-type contact layer 111 is a part of the optical path of the laser light, it is preferable not to use the thick p$^+$-type contact layer 111 having the high doping concentration in order to prevent a decrease of an optical output. In the preferred exemplary embodiment of the present invention, the two layer structure including the p$^+$-type contact layer 111 having the high doping concentration and the low-concentration semiconductor layer 112 having the low doping concentration is employed. Therefore, because the p$^+$-type contact layer 111 having the high doping concentration does not need to be formed to be thick, the decrease of the optical output can be prevented or suppressed.

In regards to the Ti-diffusion layer 142, alloying with the semiconductor layer, which is different from a simple diffusion of Ti, between the low-concentration semiconductor layer 112 and the p$^+$-type contact layer 111 and the Ti-diffusion layer 142 is progressed.

As shown in FIG. 6, after the p-side annular electrode 113 is formed, if the thermal treatment is performed, Ti diffuses into the semiconductor side. This is the same in both the conventional art and this exemplary embodiment.

The phase adjusting layer 114 made of silicon nitride (SiN$_X$) and having a circular plate shape is formed in an aperture 113a of the p-side annular electrode 113. As such, if the phase adjusting layer 114 is provided, an upper end of a resonator of the VCSEL element 100 is a top surface 114a of the phase adjusting layer 114. When the phase adjusting layer 114 is not provided, a top surface 140 of the low-concentration semiconductor layer 112 becomes the upper end of the resonator.

In this exemplary embodiment, the center of the thickness of the p$^+$-type contact layer 111 is positioned within the first node ±11 nm by counting from the top surface 114a of the phase adjusting layer 114 that is a node of light strength of a standing wave at a time of laser oscillation of the VCSEL element 100 and the upper end of the resonator. This configuration is preferably used, because the p$^+$-type contact layer 111 having the high doping concentration is positioned at a resonance node or at a neighboring portion thereof. If the center of the thickness is out of this range, the threshold current is more than the double by optical loss of the p$^+$-type contact layer 111. More preferably, the center of the thickness of the p$^+$-type contact layer 111 is positioned within the first node ±5 nm by counting from the top surface 114a of the phase adjusting layer 114 that is the node of the light strength of the standing wave at a time of laser oscillation of the VCSEL element 100 and the upper end of the resonator. Most preferably, the center of the thickness of the p$^+$-type contact layer 111 is positioned at the first node by counting from the top surface 114a of the phase adjusting layer 114 that is the node of the light strength of the standing wave at the time of laser oscillation of the VCSEL element 100 and the upper end of the resonator.

Although not provided in this exemplary embodiment, a second phase adjusting layer (not illustrated in the drawings) that covers a gap formed between the outer circumference of the phase adjusting layer 114 and the inner circumference of the p-side annular electrode 113 and having the width of 0.3 μm to 0.5 μm and the phase adjusting layer 114 and is made of SiN$_X$ such that the outer circumference thereof reaches the upper side of the p-side annular electrode 113 may be formed. In this way, since the second phase adjusting layer (not illustrated in the drawings) is formed to cover the gap, in an etching process to be described below, an acid etching liquid can be prevented from entering from the gap and corroding the p$^+$-type contact layer 111. When the second phase adjusting layer (not illustrated in the drawings) is formed, if the second phase adjusting layer (not illustrated in the drawings) is formed such that an outer circumferential region of the p-side annular electrode 113 is exposed, the outer circumference of the second phase adjusting layer (not illustrated in the drawings) does not protrude from the outer circumference of the p-side annular electrode 113. As a result, the outer circumference of the p-side annular electrode 113 and the outer circumference of the mesa post 130 can be matched with high precision. When the second phase adjusting layer (not illustrated in the drawings) is formed, a top surface of the second phase adjusting layer (not illustrated in the drawings) becomes the upper end of the resonator of the VCSEL element 100.

The upper DBR mirror 116 that is the upper multilayer film reflecting mirror composed of dielectric material is formed from the upper sides of the p-side annular electrode 113 and the phase adjusting layer 114 to the outer circumference of the mesa post. The upper DBR mirror 116 is made of 10 to 12 pairs of SiN$_X$/SiO$_2$. In order to protect a surface, the passivation film 118 that is made of SiO$_2$ and SiN$_X$ on SiO$_2$ is formed on the entire surface. SiO$_2$ and SiN$_X$ of the passivation film 118 function as SiO$_2$ and SiN$_X$ of the lowermost layer of the DBR mirror 116. The upper DBR mirror 116 that is made of SiN$_X$/SiO$_2$ has a structure in which the lowermost layer thereof is SiO$_2$ of the passivation film 118, SiN$_X$ of the passivation film 118 is formed thereon, SiN$_X$/SiO$_2$ are alternately laminated thereon, and the uppermost layer is SiN$_X$. In the passivation film 118, pairs of α-Si/SiO$_2$ or α-Si/Al$_2$O$_3$ may be configured to have the number of pairs in which appropriate reflectance of about 99% can be obtained according to a refractive index of the material thereof.

The n-type contact layer 104 extends from a lower portion of the mesa post 130 to the outside of a radial direction, and a semi-annular n-side electrode 117 that is made of AuGeNi/Au is formed on the surface thereof. In the n-side electrode 117, the outer diameter is 80 μm and the inner diameter is 40 μm.

An n-side lead electrode 119 that is made of Au is formed to contact the n-side electrode 117 through an opening 121 formed in the passivation film 118. Meanwhile, a p-side lead electrode 120 that is made of Au is formed to contact the p-side annular electrode 113 through an opening 122 formed in the passivation film 118. The n-side electrode 117 and the p-side annular electrode 113 are electrically connected to a current supply circuit (not illustrated in the drawings) provided at the outside, by the n-side lead electrode 119 and the p-side lead electrode 120, respectively.

If the VCSEL element 100 applies a voltage between the n-side electrode 117 and the p-side annular electrode 113 through the n-side lead electrode 119 and the p-side lead electrode 120 and injects a current from the current supply circuit, the current mainly flows through the p$^+$-type contact layer 111 having low resistance, the current path is confined in the current injection portion 107b by the current confinement layer 107, and the current is supplied to the active layer 105 with the high current density. As a result, carriers are injected into the active layer 105 and the active layer 105 emits natural emission light. Of the natural emission light, light that has the wavelength λ to be the laser oscillation wavelength forms a standing wave between the lower DBR mirror 102 and the upper DBR mirror 116 and is amplified by the active layer 105. If the injected current becomes equal to or more than a threshold value, the light that forms the standing wave makes laser oscillation and laser light of the 1100-nm band is emitted from the aperture 113a of the p-side annular electrode 113.

As described above, in the VCSEL element 100, the low-concentration semiconductor layer 112 exists between the p-side annular electrode 113 and the p$^+$-type contact layer 111, and the increase of resistance can be prevented. Therefore, the driving voltage decreases as described below.

Next, a method of manufacturing the VCSEL element 100 will be described.

First, the lower DBR mirror 102, the buffer layer 103, the n-type contact layer 104, the active layer 105, the oxidized layer made of AlAs, the p-type spacer layer 109, the p$^+$-type contact layer 111, and the low-concentration semiconductor layer 112 are sequentially stacked on the substrate 101 using an epitaxial growth method, and the phase adjusting layer 114 that is made of SiN$_X$ and has a circular plate shape is formed on a central region of the low-concentration semiconductor layer 112 by a plasma chemical vapor deposition (CVD) method.

Next, the p-side annular electrode 113 is selectively formed on the low-concentration semiconductor layer 112 using a lift-off method. Specifically, first, a negative-type photoresist is coated on the phase adjusting layer 114 and the low-concentration semiconductor layer 112 and a pattern of a shape of the p-side annular electrode 113 is formed. At this time, the pattern is formed such that the width thereof increases as the pattern is away from the surface of the photoresist in a depth direction. Next, a Pt/Ti layer is deposited from the upper side of the photoresist and the p-side annular electrode 113 is formed on the low-concentration semiconductor layer 112 using the lift-off method. At this time, the p-side annular electrode 113 is formed to have the same shape as the shape of the pattern on the surface of the photoresist.

Next, using the p-side annular electrode 113 as a metal mask and using the acid etching liquid, the semiconductor layer is etched to the depth reaching the n-type contact layer 104 to form the columnar mesa post 130, another mask is formed, and the n-type contact layer 104 is etched to the depth reaching the buffer layer 103.

Next, by performing the thermal treatment under a water vapor atmosphere, a layer corresponding to the current confinement layer 107 is selectively oxidized from the outer circumference side of the mesa post 130. At this time, in an outer circumferential portion of the layer that corresponds to the current confinement layer 107, a chemical reaction that becomes $2AlAs+3H_2O \rightarrow Al_2O_3+2AsH_3$ is caused and the current confinement portion 107a is formed. Since the chemical reaction is equally progressed from the outer circumferential side of the layer corresponding to the current confinement layer 107, the current injection portion 107b that is made of AlAs is formed at the center. In this case, a thermal treatment time is adjusted such that the diameter of the current injection portion 107b becomes 6 μm to 7 μm. As such, since the current injection portion 107b is formed, the center of the mesa post, the center of the current injection portion 107b, and the center of the aperture 113a of the p-side annular electrode 113 can be matched with high precision. As a result, the VCSEL element 100 can be configured as a single transverse mode laser with a high yield.

Next, the semi-annular n-side electrode 117 is formed on the surface of the n-type contact layer 104 of the outer circumferential side of the mesa post. Next, after the passivation film 118 is formed on the entire surface using the plasma CVD, the openings 121 and 122 are formed in the passivation film 118 on the n-side electrode 117 and the p-side annular electrode 113, respectively, and the n-side lead electrode 119 and the p-side lead electrode 120 that contact the n-side electrode 117 and the p-side annular electrode 113 respectively through the openings 121 and 122 are formed.

Next, after the upper DBR mirror 116 is formed using the plasma CVD method, the back surface of the substrate 101 is polished and the thickness of the substrate 101 is adjusted to 150 μm. Then, element separation is performed and the VCSEL element 100 illustrated in FIG. 1 is finished.

Next, as the exemplary embodiment of the present invention, the VCSEL element that has the structure illustrated in FIG. 1 was manufactured by the above manufacturing method. At this time, $SiN_X$ that has a composition ratio x=1.33 is used as $SiN_X$ forming the dielectric layer. As a comparable example, a method that is almost the same as the above manufacturing method is used. However, the low-concentration semiconductor layer 112 was not formed and the VCSEL element that has the structure according to the conventional art illustrated in FIG. 7 was manufactured.

Figure 5:
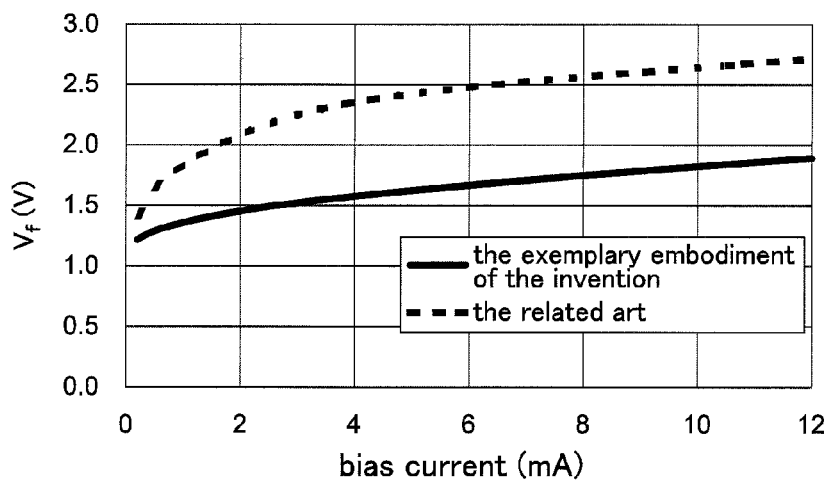
FIG. 5 is a diagram illustrating a measurement result of driving voltages at a temperature of 25° C. for the VCSEL element shown in FIG. 1 and a conventional VCSEL element.

As a measurement result of the driving voltage of the VCSEL element in a state where power was supplied at the temperature of 25° C., as shown in FIG. 5, in the conventional art, a driving voltage at a driving point of 6 mA was 2.5 V and was larger than a design value by 0.7 V. However, in the exemplary embodiment of the present invention, a driving voltage at 6 mV was equal to the design value as 1.8 V. That is, in the exemplary embodiment, the low-concentration semiconductor layer 112 prevents Ti of the p-side annular electrode 113 from corroding the $p^+$-type contact layer 111. As a result, element resistance was decreased as compared with the conventional art in which the low-concentration semiconductor layer 112 is not provided.

In the exemplary embodiment, the oxidized layer is made of AlAs. However, the oxidized layer may be made of $Al_{1-x}Ga_xAs$ (0<x<1). When the oxidized layer is made of $Al_{1-x}Ga_xAs$, the current confinement portion of the current confinement layer is made of $(Al_{1-x}Ga_x)_2O_3$ and the current injection portion is made of $Al_{1-x}Ga_xAs$.

In the exemplary embodiment, the p-side annular electrode 113 is formed using the lift-off method. However, the method of forming the p-side annular electrode 113 is not particularly limited.

In the exemplary embodiment, the current path layer that includes the contact layer is formed to have the two layers. However, even though the current path layer includes only the contact layer or includes three layers or more, the effect of the present invention can be achieved.

In the exemplary embodiment described above, as the combination of the well layer/barrier layer forming the active layer 105 of the laser of the 1100-nm band, GaInAs/GaAs is used. However, in the preferred exemplary embodiment of the present invention, according to the wavelength, (the substrate or other layer configuration is appropriately selected according to the combination of the well layer and the barrier layer), GaInNAs(Sb)/GaAs and GaInNAs(Sb)/GaNAs(Sb) may be selected in the case of the laser of a 1300-nm band, InGaAs/GaAsP may be selected in the case of the laser of a 980-nm band, and GaAs/AlGaAs may be selected in the case of the laser of an 850-nm band (the combination of the well layer and the barrier layer is not limited to the above combinations). In the quantum well layer and the barrier layer, the quantum well width may be arbitrarily designed according to the desired oscillation wavelength.

The entire disclosure of Japanese Patent Application No. 2008-314530 filed on Dec. 10, 2008 including specification, claims, drawings and summary is incorporated herein by reference in its entirety, as far as laws and regulations permits in the designated states or the selected states.

Various exemplary embodiments of the invention have hitherto been described, however, the invention is not limited to the exemplary embodiments. Therefore, the scope of the invention is limited only by the appended claims.

The invention claimed is:

1. A semiconductor laser element, comprising:
a first electrode and a second electrode to apply a current to the semiconductor laser element; and
a first reflecting mirror and a second reflecting mirror to make up an optical resonator, wherein
the resonator includes:
an active layer,
a current confinement layer confining a flow of the current between the first electrode and the second electrode, the current confinement layer including a first region to allow the flow of the current and a second region to confine the flow of the current,
a first semiconductor layer having a first doping concentration formed at a side opposite to the active layer across the current confinement layer, and
a second semiconductor layer having a second doping concentration higher than the first doping concentration formed between the first semiconductor layer and the current confinement layer, the first semiconductor layer includes a third region that faces the first region and a fourth region that faces the second region,
the first electrode is provided to contact at least a part of a surface of the first semiconductor layer in the fourth region,
the first semiconductor layer has a diffusion portion where a component of the first electrode or at least a part of components of the first electrode diffuses into the first semiconductor layer,
the second semiconductor layer contacts the diffusion portion and extends from a region contacting the diffusion portion to a portion facing the first region,
the second semiconductor layer is positioned at a node of a standing wave formed in the resonator at a time of laser oscillation of the semiconductor laser element,
the diffusion portion extends fully through the first semiconductor layer in a thickness direction thereof, and extends partially, but not fully, through the second semiconductor layer in a thickness direction thereof, and
both of a side surface of the diffusion portion and a bottom surface of the diffusion portion contact the second semiconductor layer, the bottom surface of the diffusion portion having a larger area than the side surface of the diffusion portion.

2. The semiconductor laser element according to claim 1, further comprising a mesa portion that includes at least the first semiconductor layer, the second semiconductor layer and the current confinement layer, wherein
the current confinement layer is made of a compound semiconductor containing aluminum,
the first region is made of the compound semiconductor, and
the second region is made of oxidized insulating material obtained by selectively oxidizing aluminum contained in the compound semiconductor.

3. The semiconductor laser element according to claim 2, wherein the second region is provided around the first region.

4. The semiconductor laser element according to claim 3, wherein
the first electrode is provided on the mesa portion,
the mesa portion is formed in a self-aligning manner with respect to the first electrode, and
the second region is exposed at a side surface of the mesa portion.

5. The semiconductor laser element according to claim 1, further comprising a substrate, wherein the second reflecting mirror, the active layer, the current confinement layer, the second semiconductor layer, the first semiconductor layer, the first electrode, and the first reflecting mirror are formed on the substrate in this order.

6. The semiconductor laser element according to claim 5, wherein one end of the resonator is a boundary between the first reflecting mirror and the third region.

7. The semiconductor laser element according to claim 5, further comprising a phase adjusting layer formed on the third region provided at a side opposite to the second semiconductor layer across the first semiconductor layer, the phase adjusting layer adjusting a phase of the standing wave, wherein
the one end of the resonator is a boundary between the first reflecting mirror and the phase adjusting layer.

8. The semiconductor laser element according to claim 6, wherein a center of the second semiconductor layer in its thickness direction is positioned within a range of the node of the standing wave ±11 nanometers.

9. The semiconductor laser element according to claim 1, wherein
a portion of the first electrode that contacts the first semiconductor layer includes at least one metal selected from a group consisting of Ti, Cr, Al, and W and
the component that diffuses into the first semiconductor layer is the at least one metal.

10. The semiconductor laser element according to claim 9, wherein
the portion of the first electrode that contacts the first semiconductor layer includes a metal selected from the group consisting of Ti, Cr, Al, and W and
the component that diffuses into the first semiconductor layer is the metal.

11. The semiconductor laser element according to claim 10, wherein
the portion of the first electrode that contacts the first semiconductor layer includes Ti, and
the component that diffuses into the first semiconductor layer is Ti.

12. The semiconductor laser element according to claim 1, wherein, a thickness of the first semiconductor layer "a" and a thickness of the second semiconductor layer "d" satisfy $$a < \sqrt{D_1 e^{-Ea_1/kBT} t_1 + D_2 e^{-Ea_2/kBT} t_2} a + d \quad (1)$$

where T is a temperature of thermal history process of manufacturing and using the semiconductor laser element, $t_1$ is a time when the component diffusing into the first semiconductor layer progresses through the first semiconductor layer, $t_2$ is a time when the component diffusing into the first semiconductor layer progresses through the second semiconductor layer, $D_1$ is a diffusion coefficient of the component diffusing into the first semiconductor layer in the first semiconductor layer, $D_2$ is a diffusion coefficient of the component diffusing into the first semiconductor layer in the second semiconductor layer, $Ea_1$ is an intrinsic diffusion energy of the component diffusing into the first semiconductor layer with respect to material of the first semiconductor layer, $Ea_2$ is an intrinsic diffusion energy of the component diffusing into the first semiconductor layer with respect to material of the second semiconductor layer, and kB is a Boltzmann coefficient.

13. The semiconductor laser element according to claim 1, wherein a thickness of the first semiconductor layer is 3 nanometers to 38 nanometers.

14. The semiconductor laser element according to claim 13, wherein
a thickness of the second semiconductor layer is 15 nanometers to 30 nanometers, and
a distance from the surface of the third region to an end of the current confinement layer side of the second semiconductor layer is 33 nanometers to 68 nanometers.

15. The semiconductor laser element according to claim 14, wherein the thickness of the first semiconductor layer is 10 nanometers to 20 nanometers.

16. The semiconductor laser element according to claim 1, wherein the first doping concentration is $2 \times 10^{19}$ cm$^{-3}$ or less.

17. The semiconductor laser element according to claim 1, wherein the second doping concentration is $1 \times 10^{20}$ cm$^{-3}$ or more.

18. The semiconductor laser element according to claim 1, wherein an oscillation wavelength of the semiconductor laser element is 850 nanometers or longer.

19. A method of manufacturing a semiconductor laser element, the method comprising:
preparing a substrate including an active layer, an Al-containing layer made of compound semiconductor containing aluminum, and a first semiconductor layer provided on the Al-containing layer, and including a second semiconductor layer having a first surface and a second surface facing each other and a third semiconductor layer contacting the second surface of the second semiconductor layer, the third semiconductor layer provided between the Al-containing layer and the second semiconductor layer and having a doping concentration higher than a doping concentration of the second semiconductor layer;

providing an electrode on the first surface to contact the first surface;

processing the substrate in a self-aligning manner with respect to the electrode to form a mesa portion that exposes the Al-containing layer around an entire side surface of the mesa portion; and oxidizing the Al-containing layer from an exposed portion to form the Al-containing layer into a current confinement layer having a first region made of the compound semiconductor containing aluminum and a second region made of an oxidized insulating material obtained by oxidation of aluminum contained in the compound semiconductor around the first region, and to form a diffusion portion into which a component of the electrode or at least part of components of the electrode diffuses, wherein the third semiconductor layer is positioned at a node of a light intensity of a standing wave at a time of laser oscillation of the semiconductor laser element, the diffusion portion extends fully through the second semiconductor layer in a thickness direction thereof, and extends partially, but not fully, through the third semiconductor layer in a thickness direction thereof, and both of a side surface of the diffusion portion and a bottom surface of the diffusion portion contact the third semiconductor layer, the bottom surface of the diffusion portion having a larger area than the side surface of the diffusion portion.

* * * * *